United States Patent
Kelley et al.

(10) Patent No.: US 6,284,598 B1
(45) Date of Patent: Sep. 4, 2001

(54) METHOD OF MANUFACTURING A FLASH MEMORY CELL HAVING INTER-POLY-DIELECTRIC ISOLATION

(75) Inventors: Patrick J. Kelley; Ranbir Singh; Larry B. Fritzinger; Cynthia C. Lee; John Simon Molloy, all of Orlando, FL (US)

(73) Assignee: Agere Systems Guardian Corp., Orlando, FL (US)

( * ) Notice: Subject to any disclaimer, the term of this patent is extended or adjusted under 35 U.S.C. 154(b) by 0 days.

(21) Appl. No.: 09/447,893

(22) Filed: Nov. 23, 1999

Related U.S. Application Data

(60) Provisional application No. 60/115,536, filed on Jan. 12, 1999.

(51) Int. Cl.[7] .................................................. H01L 31/336
(52) U.S. Cl. ............................ 438/257; 438/261; 438/267
(58) Field of Search ..................................... 438/257, 258, 438/260, 261, 262, 263, 264, 265, 267

(56) References Cited

U.S. PATENT DOCUMENTS

| | | | |
|---|---|---|---|
| 4,376,947 | * 3/1983 | Chiu et al. .......................... 257/316 |
| 4,861,730 | * 8/1989 | Hsia et al. ........................... 438/265 |
| 5,614,747 | * 3/1997 | Ahn et al. ............................ 257/316 |
| 5,714,413 | * 2/1998 | Brigham et al. .................... 438/301 |
| 6,069,380 | * 5/2000 | Chou et al. ......................... 257/315 |

FOREIGN PATENT DOCUMENTS

02284473-A * 11/1990 (JP) ............................. H01L/29/788

* cited by examiner

*Primary Examiner*—Tuan H. Nguyen
*Assistant Examiner*—Brook Kebede

(57) ABSTRACT

A method of forming round corners for a gate oxide between a floating gate and a control gate of a memory cell comprises the steps of forming the floating gate over a tunnel oxide; forming a mask over the floating gate; forming rounded end caps adjacent distal ends of the mask; transferring the rounding of the end caps to top corners of the floating gate; forming the gate oxide over the floating gate; and, forming the control gate over the gate oxide. A memory cell having a rounded corner interface between the floating gate and control gate is also provided.

16 Claims, 3 Drawing Sheets

METHOD OF MANUFACTURING A FLASH MEMORY CELL HAVING INTER-POLY-DIELECTRIC ISOLATION

CROSS-REFERENCE TO RELATED APPLICATION

The present application claims the benefit of Provisional Application No. 60/115,536 filed Jan. 12, 1999, which is incorporated herein by reference.

STATEMENT REGARDING FEDERALLY SPONSORED RESEARCH AND DEVELOPMENT

Not Applicable

FIELD OF THE INVENTION

This invention relates to the manufacturing of semiconductor devices. More specifically, the invention relates to a method of manufacturing an improved flash memory cell and the product of that method.

BACKGROUND OF THE INVENTION

The need for a nonvolatile means of storage for semiconductor devices has led to the development of floating gate reprogramable EEPROMS, also known as flash memory. A nonvolatile means of storage allows the device to retain data without the need to have power applied to the device. Additionally, the flash memory is reprogramable, which allows for reduced time to market for new products and the ability to upgrade existing designs by reprogramming the device after manufacturing.

Many flash memory architectures have been developed and include the thin oxide stacked gate approach, the thin oxide two transistor cell, and the thick oxide split-gate cell. These architectures function in similar manner as the charge stored on a floating gate within the cell sets the memory transistor to a logical "1" or "0". Depending upon the type of transistor, whether an enhancement or depletion transistor, the lack of or presence of electrons on the floating gate will determine whether the memory cell will or will not conduct during read. With a split gate cell, the floating gate transfers electrons across an interpoly oxide to erase. High voltage on the control gate establishes a localized electric field that initiates the Fowler-Nordheim tunneling mechanism.

An example method of producing a floating gate of a split gate cell includes: growing an oxide over a silicon substrate to form a tunnel oxide; depositing a doped poly-silicon over the tunnel oxide; and using lithography to form a floating gate. This particular method creates sharp corners on the floating gate, and these sharp corners are subsequently transferred to a gate oxide formed over the floating gate and also to a control gate formed over the gate oxide.

A problem with the sharp corners of the floating gate and control gate is that they create a strong localized field at the gate oxide disposed between them. This strong field can create electron trap sites. Eventually during use, sufficient electrons will be trapped in these electron trap sites to prevent single bits in the flash memory cell from being erased. Because the electrons become untrapped between erases of the flash memory cell, methods of preventing failures caused by the trapped electrons include having additional erase cycles or waiting sufficient time between the erase/program cycle for the electrons to be untrapped before reusing the flash memory cell. However, these methods disadvantageously slow the operation of the semiconductor device in which the split gate cells are used.

SUMMARY OF THE INVENTION

It is therefore an object of the invention to provide a flash memory cell and a method of forming a flash memory cell having improved data retention characteristics and reduced cycle time between erasure and programming of the cell.

It is yet another object of the invention to provide a flash memory cell and a method of forming a flash memory cell having a thinner gate oxide between a floating gate and a control gate.

It is another object of the invention to provide a flash memory cell and a method of forming a flash memory cell having a gate oxide which produces a reduced electric field.

It is a further object of the invention to provide a flash memory cell and a method of forming a flash memory cell having rounded corners between the floating gate and the gate oxide and between the gate oxide and the control gate.

It is still another object of the invention is to provide a flash memory cell and a method of forming a flash memory cell having a capacitor circuit with improved coupling coefficients.

These and other objects of the invention are achieved by the subject method and device.

Unless otherwise defined, all technical and scientific terms used herein have the same meaning as commonly understood by one of ordinary skill in the art to which this invention belongs. Although methods and materials similar or equivalent to those described herein can be used in the practice or testing of the present invention, the preferred methods and materials are described below.

BRIEF DESCRIPTION OF THE DRAWINGS

There are shown in the drawings embodiments of the invention that are presently preferred, it being understood, however, that the invention is not limited to the precise arrangements and instrumentalities shown.

DETAILED DESCRIPTION OF THE INVENTION

Figure 1:
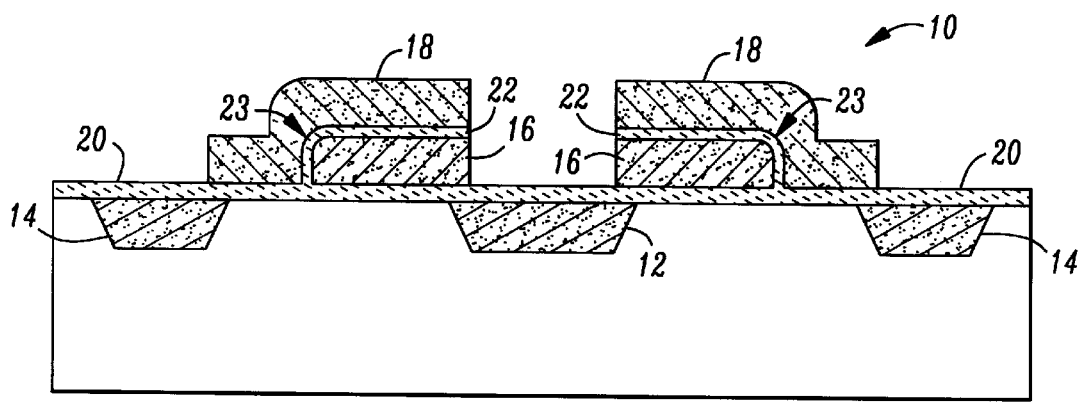
FIG. 1 is a cross-sectional view of a split gate cell according to the invention.

A flash memory cell according to the invention is illustrated in FIG. 1. The flash memory cell 10 comprises an N+ drain 12, and N+ source 14, a floating gate 16, a control gate 18, a tunnel oxide 20, and a gate oxide 22. The tunnel oxide 20 is positioned between the N+ drain 12 and the floating gate 16 and also between the N+ source 14 and the control gate 18. The gate oxide 22 is positioned between the control gate 18 and the floating gate 16.

The tunnel oxide 20 in combination with the N+ drain 12 and floating gate 16 form a first capacitor with the tunnel oxide 20 acting as the dielectric and the N+ drain 12 and the floating gate 16 acting as the electrodes. Also, the gate oxide 22 in combination with the control gate 18 and the floating gate 16 form a second capacitor with the gate oxide 22 acting as the dielectric and the control gate 18 and the floating gate 16 acting as the electrodes. The circuit of the flash memory cell 10 includes these first and second capacitors connected in series.

In a preferred embodiment of the invention, the top corner interface 23 between the floating gate 16 and control gate 18 is rounded. In this manner, the gate oxide 22 between the floating gate 16 and control gate 18 is also rounded. Having a rounded gate oxide 22 will advantageously reduce the electric field across the rounded portion of the gate oxide 22 in comparison to an electric field produced across a gate oxide having a sharp corner with little or no radius. Because the gate oxide 22 acts as a dielectric in a capacitor, the reduction of the electric field across the gate oxide 22 will improve the dielectric breakdown voltage. With an improved dielectric breakdown voltage, the gate oxide 22 can be formed thinner than was previously possible for a gate oxide having sharp corners. Also, improved dielectric breakdown voltage advantageously results in improved data retention of the flash memory cell 10.

Although the invention is not limited as to a particular radius (R) for the curve forming the corners. The radius is defined as the average radius over the arc length of the curve. In a preferred embodiment, the radius of the curve is at least 10% of the height (H) of the floating gate 16, which can be represented as:

$$R \geq 0.10H$$

In a most preferred embodiment of the invention, R=H.

Previously, when gate oxides were provided with sharp corners having little or no radiuses, these gate oxides were limited to a thickness of about 200 Å. However, the presently preferred thickness of the gate oxide 22 according to the invention is less than 150 Å. Most preferably, the thickness of the gate oxide 22 is about 125 Å. A thinner gate oxide 22, and thereby a thinner capacitor dielectric, provides improved coupling coefficients for the flash memory cell 10. With the improvement of the coupling coefficient, a smaller cycle time is required to discharge/charge the second capacitor. The smaller cycle time in turn provides for quicker memory access time thereby increasing the efficiency of the flash memory cell 10.

Figure 2:
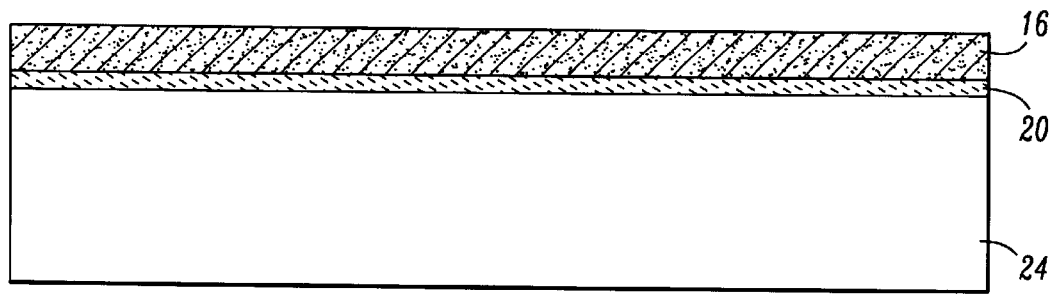
FIG. 2 shows the split gate cell as illustrated in FIG. 1 after a tunnel oxide is formed over the substrate and a floating gate layer is formed over the tunnel oxide.

In a second embodiment of the invention, FIGS. 2 through 8 illustrate a method for forming in a semiconductor device the flash memory cell 10 as illustrated in FIG. 1. As illustrated in FIG. 2, the tunnel oxide 20 is formed over the substrate 24, and a floating gate layer 16 is subsequently formed over the tunnel oxide 20. Processes capable of forming a tunnel oxide 20 over a substrate 24 are well known in the art, and the invention is not limited as to any particular process of forming the tunnel oxide 20. A common method of forming a tunnel oxide 20 is to heat a substrate 24 formed from silicon in an oxygen atmosphere. The resulting reaction forms a $SiO_2$ layer that acts as the tunnel oxide 20.

Although the tunnel oxide 20 is not limited as to a particular thickness, the presently preferred thickness of the tunnel oxide 20 is about 90–100 Å.

Once the tunnel oxide 20 is deposited over the substrate 24, the floating gate layer 16 is formed over the tunnel oxide 20.

Many processes are well known in the art of semiconductor manufacturing that are capable of forming a floating gate layer 16, and this invention is not limited as to a particular process. Although the floating gate layer 16 is not limited as to a particular material, the presently preferred floating gate layer 16 is formed from a doped poly-silicon.

Many processes of forming doped poly-silicon are known in the art, and the invention is not limited as to a particular process. For example, poly-silicon can be deposited using plasma deposition or thermal decomposition. Also, doping can be accomplished in-situ or by external doping. Examples of external doping including implanting and diffusion of both n+ type and p+ type dopants. In a preferred embodiment, the floating gate layer 16 is formed in-situ with a phosphorus dopant using silane.

Although the floating gate layer 16 is not limited as to a particular thickness, the presently preferred floating gate layer 16 is between about 500–2000 Å. In a most preferred embodiment, the thickness of the floating gate layer 16 is about 1000 Å.

Figure 3:
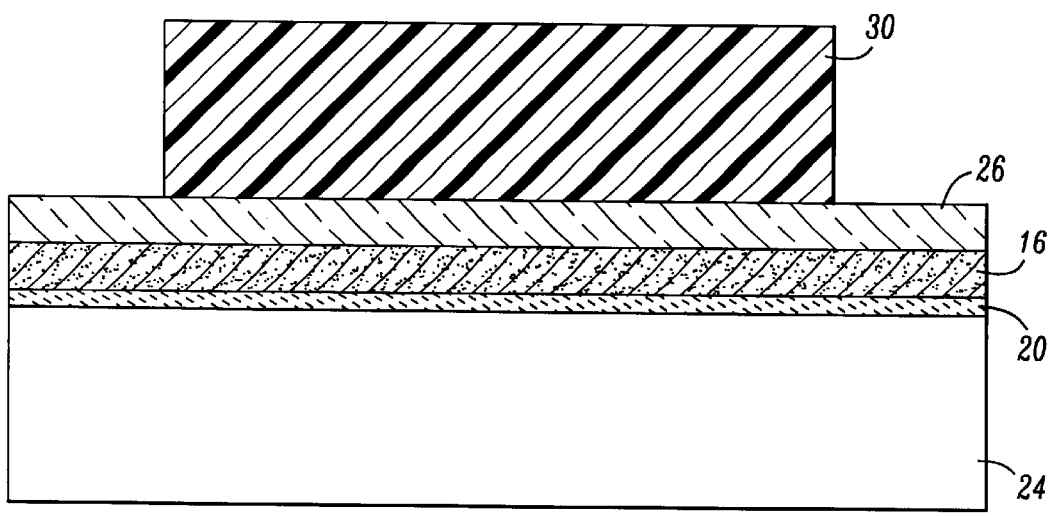
FIG. 3 shows the split gate cell as illustrated in FIG. 2 after a hard mask layer has been deposited over the floating gate layer and after a resist is deposited over areas of the hard mask layer not to be removed.

As illustrated in FIG. 3, a mask layer 26 is formed over the floating gate layer 16. The mask layer 26 is preferably formed from a material that can be selectively removed, for example silicon nitride ($Si_3N_4$), silicate glass, or phosphorus-doped silicon dioxide. Although the mask layer 26 is not limited as to a particular thickness, the presently preferred thickness of the mask layer 26 is about 2400 Å.

In a preferred embodiment, the mask layer 26 is formed from a boron phosphorus doped silicate glass. Although any process capable of forming a mask layer 26 of boron phosphorus doped silicate glass is acceptable for use with this invention, the presently preferred method of forming the mask uses tetraethoxysilane, Si $(OC_2H_5)_4$, abbreviated as TEOS, as a precursor material. The overall reaction is commonly written as:

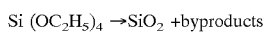

$$Si\ (OC_2H_5)_4 \rightarrow SiO_2\ + byproducts$$

As is known by those skilled in the art, silicate glass is formed by decomposing the TEOS in a chemical vapor deposition (CVD) reactor at temperatures of about 650° C. to 750° C. In a preferred embodiment the TEOS film is formed by plasma enhanced chemical vapor deposition (PECVD).

Any method of doping the silicate glass with boron and phosphorus is acceptable for use in the invention. For example, phosphorus doping of silicate glass can be accomplished by adding phosphorus compounds, typically phosphine or trimethylphosphite, to the TEOS reaction. Doping of the silicate with boron is typically accomplished by adding diborane, boron trichloride, or trimethylborate to the TEOS reaction. In a preferred embodiment, the silicate glass is doped with boron and phosphorus using boron phosphorus tetraethoxysilane (BPTEOS) as a precursor material.

Figure 4:
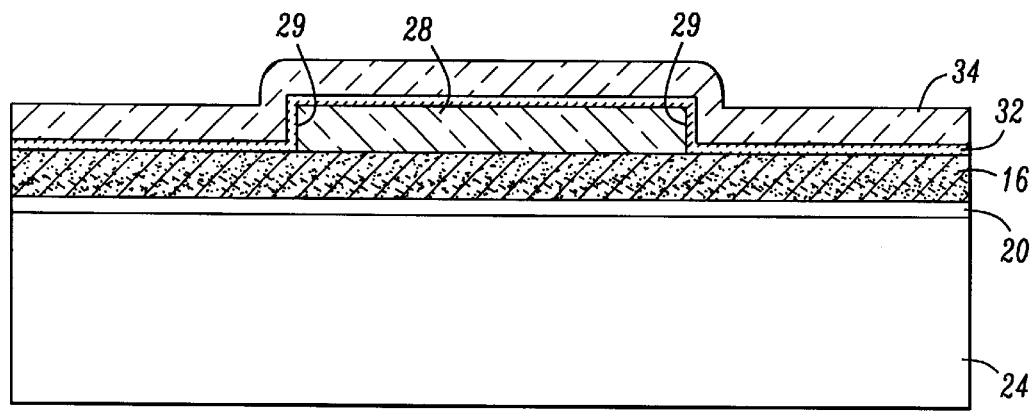
FIG. 4 shows the split gate cell as illustrated in FIG. 3 after a portion of the hard mask layer has been removed to form a mask and after a cap layer is formed over the floating gate layer and the mask.

Once the mask layer 26 is formed, the mask layer 26 will be selectively etched to form a mask 28 (best shown in FIG. 4). Any method capable of forming a mask 28 is acceptable for use with this invention. However, the presently preferred method of forming a mask 28 is to deposit a resist 30 over the areas not to be etched, which includes the mask 28. After the resist 30 is applied, the unexposed mask layer 26 is anisotropically etched to remove any unexposed mask layer 26. Once the etching has been completed, the resist 30 is then removed. The resist 30 preferably covers a sufficient width of the mask layer 26 to leave a mask 28 having a width that is slightly less than the desired final width of the floating gate 16.

As illustrated in FIG. 4, a cap layer 34 is formed over the mask 28 and the floating gate layer 16. Processes capable of forming a cap layer 34 are well known in the art, and the invention is not limited as to a particular method. However, the cap layer 34 is formed so as to have a greater thickness adjacent distal ends 29 of the mask 28.

Before forming the cap layer 34, however, an undoped oxide 32 can be formed around the floating gate layer 16 and mask 28. The undoped oxide 32 acts as a barrier layer between the floating gate layer 16 to prevent contamination of the floating gate 16.

Any method of forming the undoped oxide 32 is acceptable for use with this invention. However, in a preferred embodiment the undoped oxide 32 is formed using PECVD. Although the cap layer 34 can be formed from any material capable of being etched, the cap layer 34 is preferably formed from a boron phosphorus doped silicate glass.

Figure 5:
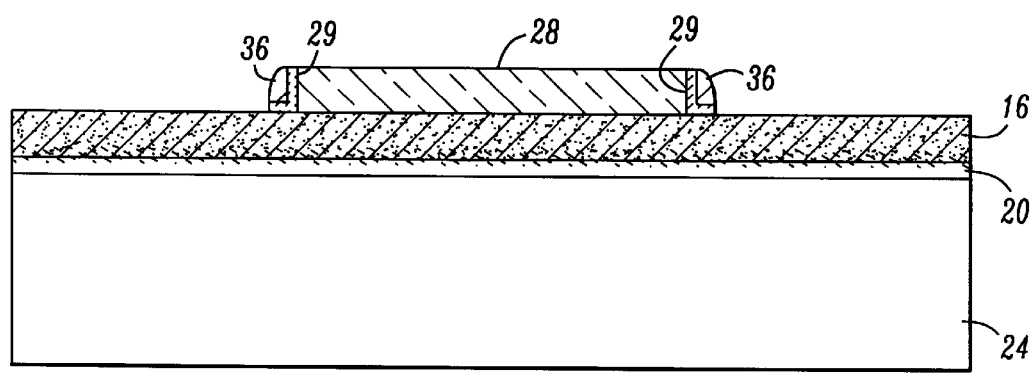
FIG. 5 shows the split gate cell as illustrated in FIG. 4 after the cap layer has been removed to form rounded caps adjacent the mask.

As illustrated in FIG. 5, once the cap layer 34 has been formed, the cap layer 34 is etched to remove all the material of the cap layer 34 except for caps 36 having rounded corners on opposing distal ends 29 of the mask 28. Before etching, the combined width of the caps 36 and mask 28 is preferably about the desired width of the floating gate 16.

Any method of etching the cap layer 34 to form caps 36 having rounded corners is acceptable for use with this invention. However, the presently preferred etching process is a blanket anisotropic etch. The caps 36 remain because the cap layer 34 deposited having a greater thickness adjacent the distal ends 29 of the mask 28 and upon uniform removal of the cap layer 34, only the thickest material adjacent the distal ends 29 of mask 28 remains.

Figure 6:
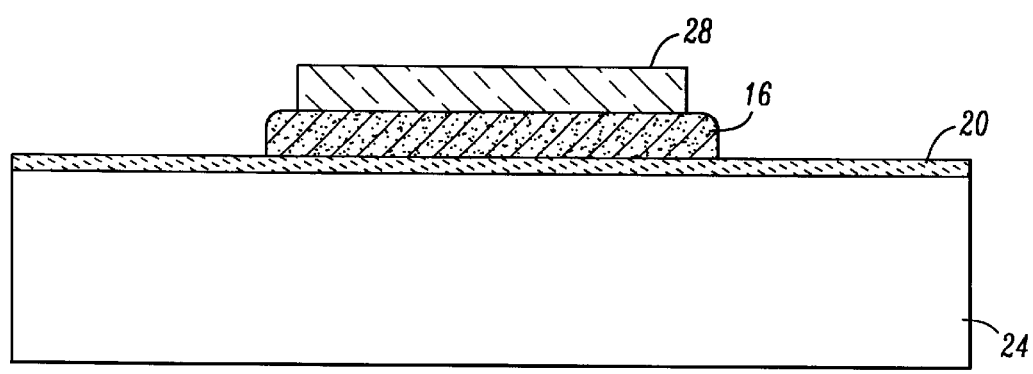
FIG. 6 shows the split gate cell as illustrated in FIG. 5 after the forming of a floating gate having rounded corners.

As illustrated in FIG. 6, upon etching of the cap layer 34, the rounding of the caps 36 are transferred to the top corners of the floating gate 16. Rounding refers both to the radius of the corner and whether the radius is constant along the arc length of the curve. This transferring of the rounding from the caps 36 to the floating gate 16 is not limited to an exact transfer. For example, the radius of the top corners of the caps 36 may be greater or smaller than the radius transferred to the top corners of the floating gate 16. Furthermore, only a portion of the arc length of the top corner may be transferred from the caps 36 to the floating gate 16.

Although any method of transferring the rounding of the caps 36 to the floating gate 16 is acceptable, the presently preferred method is a plasma etch. In this manner, as the cap 36 is reduced in size, the floating gate layer 16 below the cap 36 is exposed and subsequently also reduced.

The degree of rounding of the corners of the floating gate 16 can be dependent on several factors. One factor is the initial rounding of the caps 36, as the degree of rounding of the caps 36 will determine the rounding of the corners of the floating gate 16.

Another factor is the etch selectivity. For example, if the material of the floating gate layer 16 and the caps 36 are etched at about the same material removal rate, the rounding of cap 36 will be transferred to the floating gate 16. If the material of the cap 36 is removed at a smaller rate than the material of the floating gate layer 16, then a smaller portion of the rounding will be transferred to the floating gate 16. Likewise, if the material of the cap 36 is removed at a rate higher than the material of the floating gate layer 16, a greater portion of the rounding will be transferred to the floating gate 16.

It is noted that the thickness of the mask layer 26 is still another factor that can determine the degree of rounding of the corners of the floating gate 16. With all other factors being equal, as the thickness of the mask layer 26 increases, the degree of rounding decreases.

Figure 7:
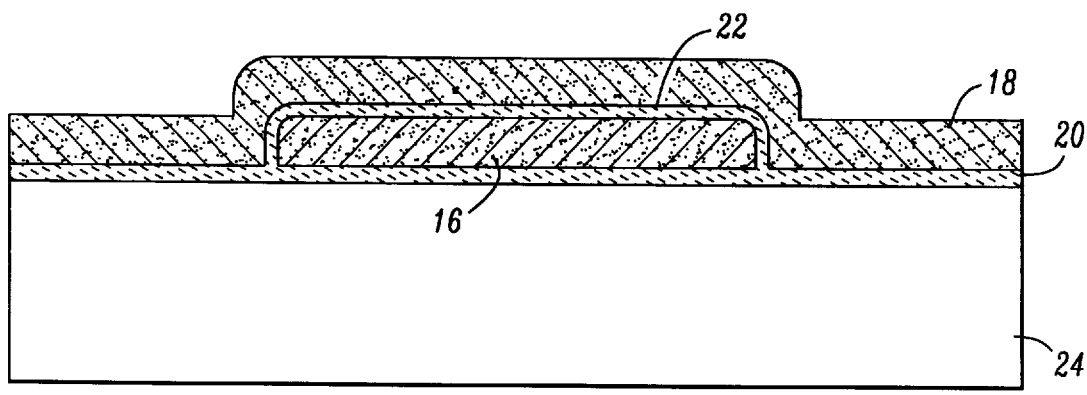
FIG. 7 shows the split gate cell as illustrated in FIG. 6 after the mask has been removed, a gate oxide formed over the floating gate, and a control gate layer formed over the gate oxide and tunnel oxide.

As illustrated in FIG. 7, once the floating gate layer 16 has been etched, the mask 28 is preferably removed without damaging the floating gate 16. Although any process of removing the mask 28 without damaging the properties of the floating gate 16 is acceptable for use with the invention. In the presently preferred embodiment of the invention, in which a boron phosphorus doped silicate glass is the material of the mask 28, the mask 28 is preferably removed in a $NH_4OH/H_2O_2$ solution. Upon removal of the mask 28, a floating gate 16 having rounded corners is provided.

Furthermore, upon completion of the floating gate 16, the flash memory cell 10 can be completed using known processing methods. These include forming a gate oxide 22 over the floating gate 16 and forming the control gate 18 over the gate oxide 22.

The gate oxide 22 can be formed from any high K material, for example oxide-nitride (ON) and oxide-nitride-oxide (ONO); however, the presently preferred gate oxide 22 is formed from $SiO_2$.

Figure 8:
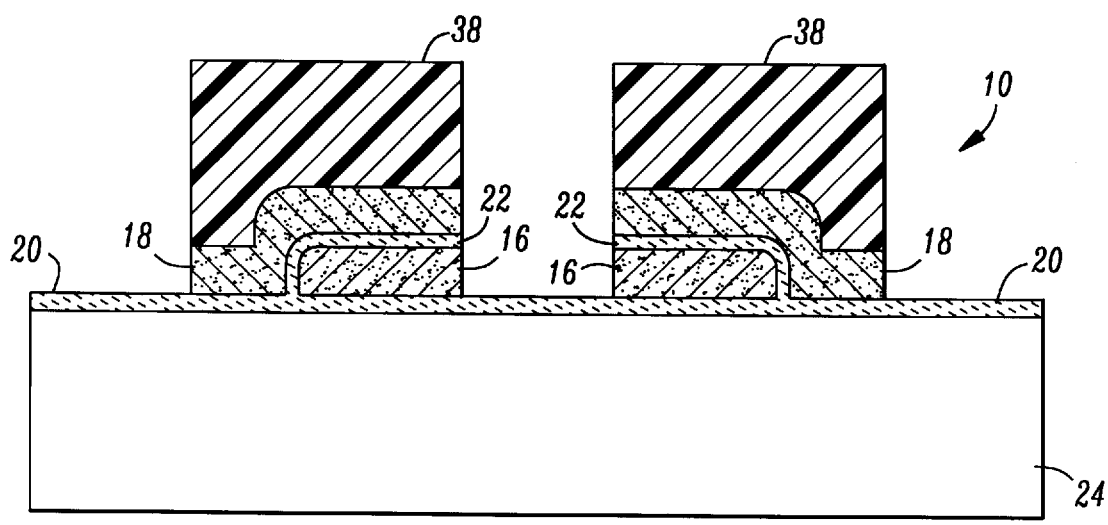
FIG. 8 shows the split gate cell as illustrated in FIG. 7, after etching.

As illustrated in FIG. 8, upon formation of the gate oxide 22 and a control gate layer 18, the flash memory cell 10 is preferably completed by removing portions of the control gate layer 18 and floating gate 16 as is known in the art. Although any method so capable of removing portions of the control gate layer 18 and floating gate 16 is acceptable for use in the invention, the preferred process is to form a mask 38 over the areas not to be removed and to anisotropically etch the floating gate 16 and the control gate layer 18. The mask 38 can then be subsequently removed (not shown).

It should be understood that the examples and embodiments described herein are for illustrative purposes only and that various modifications or changes in light thereof will be suggested to persons skilled in the art and are to be included within the spirit and purview of this application. The invention can take other specific forms without departing from the spirit or essential attributes thereof for an indication of the scope of the invention.

What is claimed is:

1. A method of forming a memory cell, comprising the steps of:

forming a mask over a floating gate layer;

forming rounded end caps adjacent distal ends of the mask;

transferring a profile of the rounded end caps to the floating gate layer, thus forming a floating gate having rounded top corners; and forming a gate oxide over the floating gate, the gate oxide having rounded top corners.

2. The method of claim 1, wherein forming rounded end caps adjacent distal ends of the mask further includes:

depositing a mask layer over the floating gate layer;

reducing the mask layer to form the mask;

depositing a cap layer over the mask and the floating gate layer; and, reducing the cap layer to form the rounded end caps.

3. The method of claim 2, wherein the reducing of the mask layer is by anisotropically etching the mask layer.

4. The method of claim 2, wherein the reducing of the cap layer is by blanket etching the cap layer.

5. The method of claim 1, further comprising the step of forming a control gate over the gate oxide.

6. The method of claim 5, wherein forming a control gate over the gate oxide includes transferring the rounded top corners of the gate oxide to control the gate.

7. The method of claim 1, wherein forming a floating gate includes etching the floating gate layer and rounded end caps.

8. The method of claim 7, wherein the etching is by plasma etch.

9. The method of claim 1, wherein the rounded top corners of the floating gate have a radius of about at least 10% of a height of the floating gate.

10. The method of claim 9, wherein the radius of the rounded top corners of the floating gate is about the height of the floating gate.

11. A method of forming a floating gate having rounded top corners for a memory cell, comprising the steps of:

forming a floating gate layer;

forming a mask layer over the floating gate layer;

reducing the mask layer to form a mask;

forming a cap layer over the mask and the floating gate layer;

reducing the cap layer to form rounded end caps adjacent distal ends of the mask;

forming the floating gate; and, transferring rounding of the end caps to the floating gate to form rounded top corners on the floating gate, the transferring rounding step concurrent with the floating gate forming step.

12. The method of claim 11, wherein the reducing of the mask layer is by anisotropically etching the mask layer.

13. The method of claim 11, wherein the reducing of the cap layer is by blanket etching the cap layer.

14. The method of claim 11, wherein the radius of the top corners of the floating gate is at least 10% of a height of the floating gate.

15. The method of claim 14, wherein the radius of the top corners of the floating gate is about the height of the floating gate.

16. The method of claim 11, wherein the floating gate forming step is by plasma etch.

* * * * *